(12) United States Patent
Rinner et al.

(10) Patent No.: US 10,506,699 B2
(45) Date of Patent: Dec. 10, 2019

(54) APPARATUS FOR GENERATING AN ATMOSPHERIC PRESSURE PLASMA

(71) Applicant: EPCOS AG, München (DE)

(72) Inventors: Franz Rinner, Deutschlandsberg (AT); Pavol Kudela, Deutschlandsberg (AT); Markus Puff, Graz (AT)

(73) Assignee: EPCOS AG, München (DE)

( * ) Notice: Subject to any disclaimer, the term of this patent is extended or adjusted under 35 U.S.C. 154(b) by 0 days.

(21) Appl. No.: 16/061,860

(22) PCT Filed: Oct. 20, 2017

(86) PCT No.: PCT/EP2017/076891
§ 371 (c)(1),
(2) Date: Jun. 13, 2018

(87) PCT Pub. No.: WO2018/077754
PCT Pub. Date: May 3, 2018

(65) Prior Publication Data
US 2018/0368244 A1    Dec. 20, 2018

(30) Foreign Application Priority Data
Oct. 25, 2016  (DE) .................. 10 2016 120 324

(51) Int. Cl.
| | |
|---|---|
| H05H 1/24 | (2006.01) |
| H01L 41/053 | (2006.01) |
| H01L 41/107 | (2006.01) |
| H01L 41/04 | (2006.01) |

(52) U.S. Cl.
CPC ............. *H05H 1/24* (2013.01); *H01L 41/044* (2013.01); *H01L 41/053* (2013.01); *H01L 41/107* (2013.01); *H05H 2001/2481* (2013.01)

(58) Field of Classification Search
CPC .......................................................... H05H 1/24
USPC ...................................................... 250/423 R
See application file for complete search history.

(56) References Cited

U.S. PATENT DOCUMENTS

| | | | |
|---|---|---|---|
| 5,763,983 A | 6/1998 | Huang | |
| 6,124,678 A * | 9/2000 | Bishop | H05B 41/2827 315/209 PZ |
| 9,711,333 B2 * | 7/2017 | Sieber | H01J 37/32449 |
| 9,788,404 B2 * | 10/2017 | Nettesheim | H01L 41/053 |
| 2009/0122941 A1 * | 5/2009 | Engemann | H01L 41/107 376/145 |
| 2016/0120016 A1 | 4/2016 | Kovaleski et al. | |

(Continued)

FOREIGN PATENT DOCUMENTS

| | | |
|---|---|---|
| DE | 10259069 A | 7/2004 |
| DE | 102010055266 A1 | 6/2012 |

(Continued)

*Primary Examiner* — Phillip A Johnston
(74) *Attorney, Agent, or Firm* — Slater Matsil, LLP

(57) ABSTRACT

An apparatus for generating an atmospheric pressure plasma is disclosed. In an embodiment an apparatus includes a first support element and a piezoelectric transformer supported by the first support element, wherein the piezoelectric transformer is supported at a position at which an oscillation node is formed when the piezoelectric transformer is operated at an operating frequency that is lower than its parallel resonant frequency, and wherein the piezoelectric transformer is configured to generate a non-thermal atmospheric pressure plasma.

16 Claims, 9 Drawing Sheets

(56) References Cited

U.S. PATENT DOCUMENTS

| | | | |
|---|---|---|---|
| 2017/0208675 | A1 | 7/2017 | Doellgast et al. |
| 2018/0212138 | A1* | 7/2018 | Doellgast ................ H01L 23/32 |
| 2018/0249569 | A1 | 8/2018 | Weilguni et al. |
| 2018/0331277 | A1 | 11/2018 | Doellgast et al. |

FOREIGN PATENT DOCUMENTS

| | | |
|---|---|---|
| DE | 102013100617 A1 | 7/2014 |
| JP | S4810369 U | 2/1973 |
| JP | H0878749 A1 | 3/1996 |
| JP | 2009110589 A | 5/2009 |
| WO | 2014115050 A1 | 7/2014 |
| WO | 2016012282 A1 | 1/2016 |
| WO | 2017012827 A1 | 1/2017 |
| WO | 2017029099 A | 2/2017 |
| WO | 2017081015 A1 | 5/2017 |

* cited by examiner

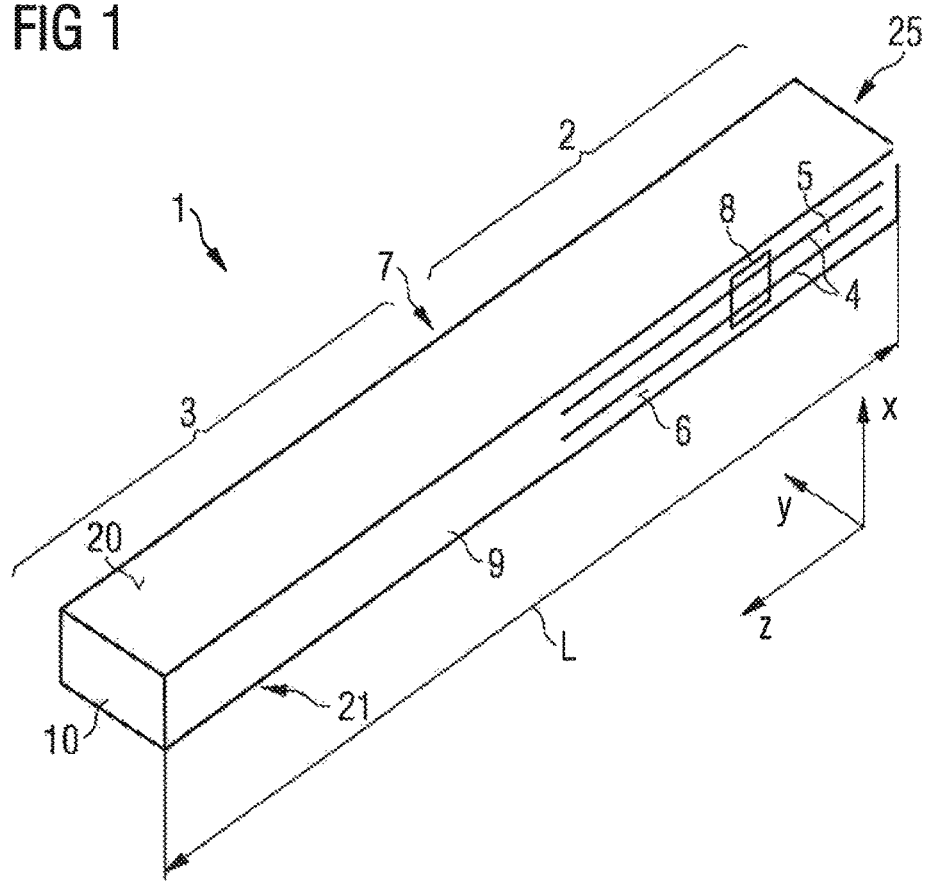

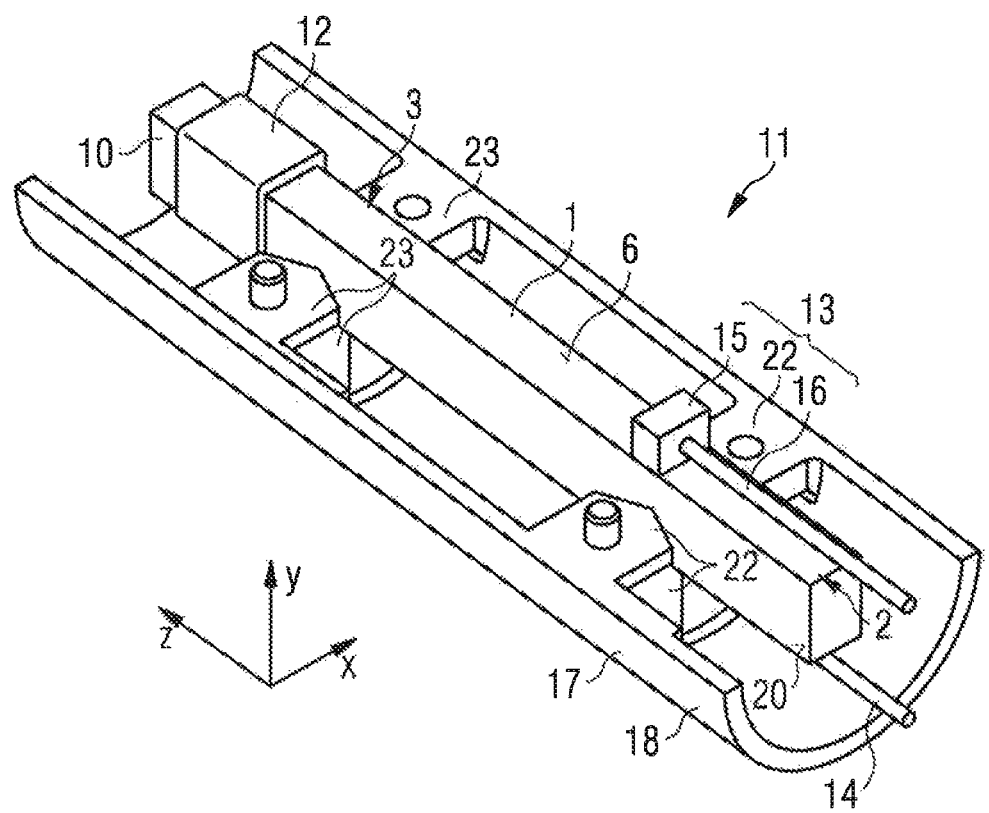

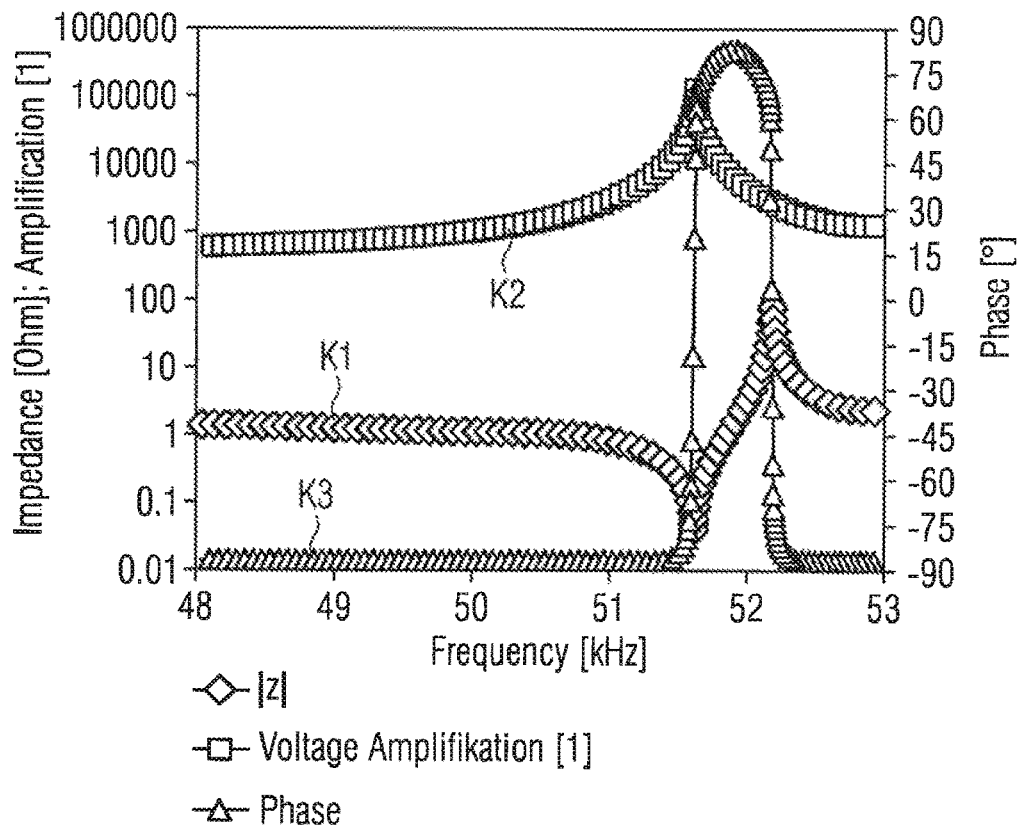
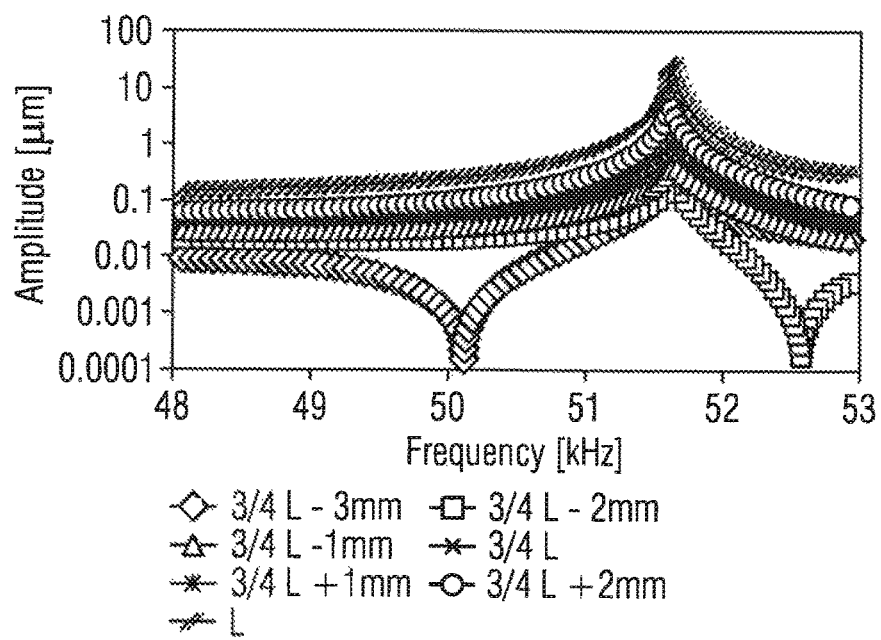

◇ 3/4 L - 3mm    ☐ 3/4 L - 2mm
△ 3/4 L -1mm    ✳ 3/4 L
✱ 3/4 L +1mm   ○ 3/4 L +2mm
— L

◇ Shift real part [mm]

◇ 3/4 L − 3mm   □ 3/4 L − 2mm
△ 3/4 L −1mm   ✱ 3/4 L
✻ 3/4 L +1mm   ○ 3/4 L +2mm
— L

◇ Shift real part [mm]
△ Shift Imaginary part [mm]

1/4 L    3/4 L

3/4 L

1/4 L

APPARATUS FOR GENERATING AN ATMOSPHERIC PRESSURE PLASMA

This patent application is a national phase filing under section 371 of PCT/EP2017/076891, filed Oct. 20, 2017, which claims the priority of German patent application 10 2016 120 324.6, filed Oct. 25, 2016, each of which is incorporated herein by reference in its entirety.

TECHNICAL FIELD

The present invention relates to an apparatus for generating an atmospheric pressure plasma. In this case, the atmospheric pressure plasma is a non-thermal plasma.

BACKGROUND

The apparatus has, in particular, a piezoelectric transformer, which generates an output voltage that can be used for ionization of a process gas. The apparatus is intended to prevent movements of the piezoelectric transformer, in particular in a longitudinal direction, relative to a mount of the apparatus. However, at the same time, the mount is intended not to interfere with the piezoelectric transformer in such a way that oscillations of the transformer are damped, since this would reduce the efficiency of the plasma generation.

SUMMARY OF THE INVENTION

Embodiments of the invention provide an apparatus that satisfies these mutually initially contradictory requirements as well as possible.

In various embodiments, an apparatus for generating an atmospheric pressure plasma is proposed, the apparatus having a piezoelectric transformer and a first support element. The piezoelectric transformer is supported on the support element, wherein the piezoelectric transformer is supported on the first support element at a position at which an oscillation node is formed when the piezoelectric transformer is operated at an operating frequency that is lower than its parallel resonant frequency, and when the piezoelectric transformer is used to generate a non-thermal atmospheric pressure plasma.

An output-side load may be formed through the generation of the plasma. This results in a shift of the oscillation nodes. In the case of a homogeneously uniform rod without a piezo effect having a length L, which at its resonant frequency is excited to perform oscillations, oscillation nodes located at a distance of ¼ L from an input-side end side and at a distance of ¾ L from the input-side end side should be expected. However, it has been shown that, in the case of a piezoelectric transformer used for plasma generation, the position of the oscillation nodes is shifted compared to the values ¼ L and ¾ L mentioned above. In this case, different effects play a role, which will be explained below. Embodiments of the present invention makes it possible to take the shift in the position of the oscillation nodes into account and to position the first support element accordingly. This can ensure that the first support element damps the piezoelectric transformer only to a minimal extent.

For the shift in the position of the oscillation nodes in the case of a piezoelectric transformer compared to the homogeneous rod, particularly the following effects may be relevant: the generation of a plasma at the output side of the piezoelectric transformer produces a load that interacts with the piezoelectric transformer. Due to the interaction with the load, the frequency at which the piezoelectric transformer exhibits resonant behavior is shifted from its parallel resonant frequency, at which it has a maximum in terms of its impedance without a load and thus exhibits resonant behavior, toward a lower frequency. This lower frequency may be the operating frequency at which the piezoelectric transformer is excited. The fact that the piezoelectric transformer is excited at an operating frequency that is lower than the parallel resonant frequency results in a change in the position of the oscillation nodes. The oscillation nodes are shifted in the direction of the output side.

Furthermore, the piezoelectric transformer may have a modulus of elasticity, the distribution of which is different from the modulus of elasticity of a homogeneous rod. The modulus of elasticity in the input region is different from the modulus of elasticity in the output region since the piezoelectric layers in the input region are polarized perpendicularly to the piezoelectric material in the output region. The input region also has inner electrodes, whereas the output region has a monolithic piezoelectric layer, such that the density of the input region differs from the density of the output region. The different moduli of elasticity of the input region and the output region cause a shift of the oscillation nodes toward the input-side end side.

The effect of the shift of the oscillation nodes toward the input-side end side on account of the different moduli of elasticity of the input region and the output region may be more pronounced than the effect of the shift of the oscillation nodes toward the output-side end side on account of the excitation at the operating frequency that is lower than the parallel resonant frequency.

The difference between the operating frequency and the parallel resonant frequency may be between 10 kHz and 0.1 kHz. This difference can preferably be between 8 kHz and 0.1 kHz, in particular between 5 kHz and 0.1 kHz. The operating frequency is selected to be smaller than the parallel resonant frequency in order to take account of the fact that the frequency-dependent impedance spectrum shifts toward lower frequencies when a load produced by the plasma generation is applied to the output side. The shift of the frequency at which the piezoelectric transformer exhibits resonant behavior can typically be in the ranges specified here.

The parallel resonant frequency can be defined as that frequency at which an impedance of the piezoelectric transformer has a maximum when an AC voltage at a frequency is applied to the piezoelectric transformer and the piezoelectric transformer does not generate plasma. The parallel resonant frequency is accordingly characterized by a maximum of the impedance when the piezoelectric transformer is operated without a load.

In an alternative exemplary embodiment, the operating frequency at which the piezoelectric transformer is operated can be lower than the series resonant frequency. In particular, the difference between the operating frequency and the series resonant frequency may in this case be between 10 kHz and 0.1 kHz. The series resonant frequency can be defined as that frequency at which an impedance of the piezoelectric transformer has a minimum when an AC voltage at a frequency is applied to the piezoelectric transformer and the piezoelectric transformer does not generate plasma. The series resonant frequency is accordingly characterized by a minimum of the impedance when the piezoelectric transformer is operated without a load.

The piezoelectric transformer can have an input region and an output region, wherein the input region has an input-side end side of the piezoelectric transformer, the input-side end side pointing away from the output region, and wherein the output region has an output-side end side, which points away from the input region. A length L can specify the distance of the input-side end side from the output-side end side. A distance of the position at which the piezoelectric transformer is supported on the first support element from the input-side end side may be in a range between ¼ L-5 mm and ¼ L-0.05 mm. Here, in each case the center point of the support element is viewed in the longitudinal direction. Here, longitudinal direction can denote the direction perpendicular to the input-side end side and perpendicular to the output-side end side. The distance can preferably be in a range between ¼ L-3 mm and ¼ L-0.05 mm, in particular between ¼ L-1.5 mm and ¼ L-0.05 mm.

The length L can be, for example, between 50 mm and 100 mm; L is preferably 72 mm. It has been shown that a first oscillation node is shifted by a few mm toward the input-side end side compared to the position of ¼ L expected in theory for a homogeneous rod. The selection of the position of the first support element in the range specified above can make it possible to arrange the support element at the actual oscillation node that forms during operation of the piezoelectric transformer. This can ensure that the first support element damps the piezoelectric transformer only to a minimal extent and therefore the efficiency during plasma generation does not deteriorate.

The input region of the piezoelectric transformer can be configured to convert an applied AC voltage to a mechanical oscillation, wherein the output region is configured to convert a mechanical oscillation to an electrical voltage. The output region can be attached to the input region directly in the longitudinal direction.

Further, the apparatus can have a second support element on which the piezoelectric transformer is supported, wherein the piezoelectric transformer is supported on the second support element at a position at which an oscillation node is formed when the piezoelectric transformer is operated at the operating frequency and the piezoelectric transformer is used to generate a non-thermal atmospheric pressure plasma.

The first and the second support element can be arranged at different positions of the piezoelectric transformer. The output region of the piezoelectric transformer can be supported on the second support element. The input region of the piezoelectric transformer can be supported on the first support element.

In particular, the apparatus can have a plurality of first support elements, which are each arranged at the same distance from the input-side end side, and a plurality of second support elements, which are each arranged at the same distance from the input-side end side.

A distance of the position at which the piezoelectric transformer is supported on the second support element from the input-side end side can be in a range between ¾ L-0.5 mm and ¾ L-0.05 mm. The distance can preferably be in a range between ¾ L-3 mm and ¾ L-0.05 mm, in particular between ¾ L-1.5 mm and ¾ L-0.05 mm. The position of the oscillation node formed in the output region of the piezoelectric transformer can also be shifted toward the input side of the piezoelectric transformer on account of the effects discussed above.

The distance of the position at which the piezoelectric transformer is supported on the first support element from the input-side end side can be ¼ L-A. The distance of the position at which the piezoelectric transformer is supported on the second support element from the input-side end side can be ¾ L-B. B can be greater than A. It has been shown that the shift of the oscillation node toward the input-side end side is greater in the output region of the piezoelectric transformer than in the input region. This effect can be taken into account in the positioning of the support elements by the selection of B>A.

The first support element can be configured in such a way that it elastically deforms in the event of compression and in the event of expansion of the piezoelectric transformer. This can also apply to the second support element. Due to the elastic deformation, the first support element can act in a resilient manner. The first and the second support element can form, in particular together with the piezoelectric transformer, an oscillating system. Since the first support element and possibly also the second support element therefore oscillate together with a piezoelectric transformer, the support elements do not damp the oscillation of the transformer. This can ensure that no energy is lost through the support elements.

The first support element can have a material selected from polybutylene terephthalate, polytetrafluoroethylene, polyamide or polyamide comprising glass-fiber proportions. The second support element can also have one of these materials. The materials are distinguished by a particularly high hardness and accordingly a high quality factor. These materials accordingly experience hardly any plastic deformation. This can ensure that the support elements produced from these materials do not damp an oscillation of the piezoelectric transformer.

The first support element can have a shape that tapers in a wedge shape in a direction toward the piezoelectric transformer and accordingly bear against the piezoelectric transformer in approximately linear fashion. The second support element can also have a shape that tapers in a wedge shape toward the piezoelectric transformer. The shape that tapers in a wedge shape can make it possible for the area at which the piezoelectric transformer is supported on the support elements to be configured to be as small as possible. This can also ensure that the support elements do not lead to damping of the oscillation of the piezoelectric transformer.

The piezoelectric transformer can be configured to generate a non-thermal atmospheric pressure plasma at the output-side end side. The piezoelectric transformer can be a Rosen-type transformer, for example.

A further aspect of embodiments of the present invention relates to a plasma generator, which has the apparatus described above and a housing in which the apparatus is arranged.

An actuation circuit for actuating the piezoelectric transformer can furthermore be arranged in the housing. The actuation circuit can make it possible, in particular, to apply an AC voltage at the operating frequency to the input region of the piezoelectric transformer.

The actuation circuit can be electrically contact-connected to the piezoelectric transformer by means of the contact element. The plasma generator can furthermore have means for supplying a process gas to the piezoelectric transformer. The housing can furthermore have an outlet opening from which the plasma generated by the piezoelectric transformer can emerge. Due to the design of the outlet opening, it may be possible to form a plasma jet in a desired manner.

BRIEF DESCRIPTION OF THE DRAWINGS

In the text that follows, preferred exemplary embodiments of the present invention are described with reference to the figures.

FIG. 1 shows a perspective view of a piezoelectric transformer;

FIG. 2 shows an apparatus for generating an atmospheric pressure plasma;

FIGS. 3 to 14 show simulation results showing a shift of the oscillation nodes in a piezoelectric transformer.

DETAILED DESCRIPTION OF ILLUSTRATIVE EMBODIMENTS

Figure 5:
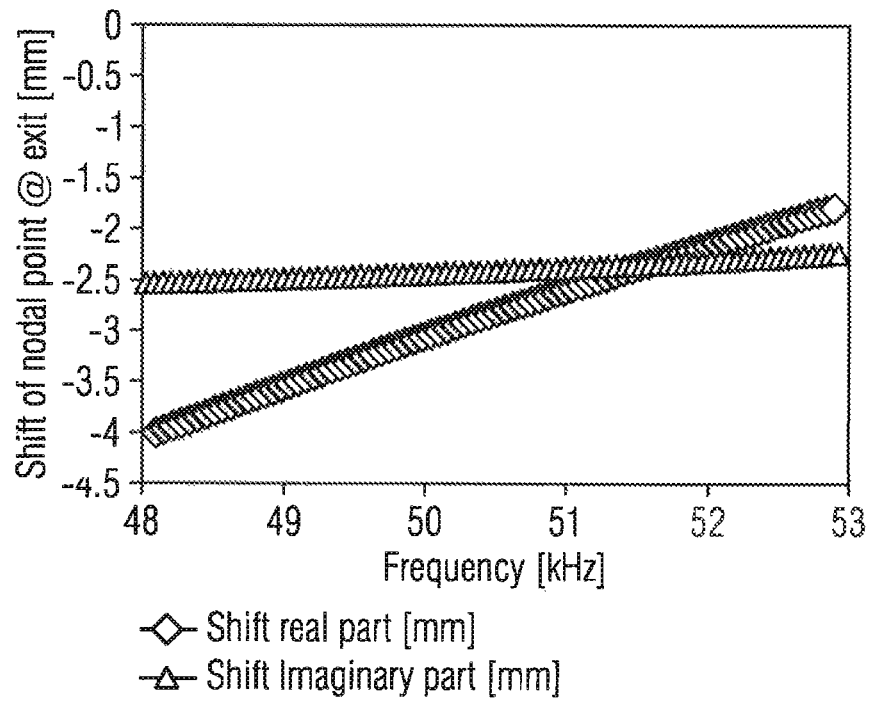

FIG. 1 shows a perspective view of a piezoelectric transformer 1. The piezoelectric transformer 1 can be used, in particular, in an apparatus 11 for generating non-thermal atmospheric pressure plasma.

A piezoelectric transformer 1 is a design of a resonant transformer, which is based on piezoelectricity and, in contrast to the conventional magnetic transformers, represents an electromechanical system. The piezoelectric transformer 1 is a Rosen-type transformer, for example.

The piezoelectric transformer 1 has an input region 2 and an output region 3, wherein the output region 3 is attached to the input region 2 in a longitudinal direction z. In the input region 2, the piezoelectric transformer 1 has electrodes 4 to which an AC voltage can be applied. The electrodes 4 extend in the longitudinal direction z of the piezoelectric transformer 1. The electrodes 4 are stacked alternately with a piezoelectric material 5 in a stacking direction x, which is perpendicular to the longitudinal direction z. The piezoelectric material 5 is in this case polarized in the stacking direction x.

The electrodes 4 are arranged within the piezoelectric transformer 1 and are also referred to as inner electrodes. The piezoelectric transformer 1 has a first side surface 6 and a second side surface 7 opposite the first side surface 6. A first outer electrode 8 is arranged on the first side surface 6. A second outer electrode (not shown) is arranged on the second side surface 7. The inner electrodes 4 are electrically contact-connected in the stacking direction x alternately either to the first outer electrode 8 or to the second outer electrode.

The piezoelectric transformer 1 furthermore has a third side surface 20 and a fourth side surface 21, which are located opposite one another and which are arranged perpendicular to the first side surface 6 and the second side surface 7. The surface normals of the third and the fourth side surfaces 20, 21 each show in the stacking direction x.

The input region 2 can be actuated using a low AC voltage applied between the electrodes 4. On account of the piezoelectric effect, the AC voltage applied on the input side is initially converted to a mechanical oscillation. The frequency of the mechanical oscillation in this case depends substantially on the geometry and the mechanical design of the piezoelectric transformer 1.

The output region 3 has piezoelectric material 9 and is free of inner electrodes. The piezoelectric material 9 in the output region is polarized in the longitudinal direction z. The piezoelectric material 9 of the output region 3 may be the same material as the piezoelectric material 5 of the input region 2, wherein the piezoelectric materials 5 and 9 may differ in their polarization direction. In the output region 3, the piezoelectric material 9 is shaped to form a single monolithic layer, which is fully polarized in the longitudinal direction z. In this case, the piezoelectric material 9 in the output region 3 has just one single polarization direction.

If an AC voltage is applied to the electrodes 4 in the input region 2, then a mechanical wave forms within the piezoelectric material 5, 9, the wave generating an output voltage as a result of the piezoelectric effect in the output region 3. The output region 3 has an output-side end side 10. An electrical voltage is therefore generated in the output region 3 between the end side 10 and the end of the electrodes 4 of the input region 2. In this case, a high voltage is generated at the output-side end side 10. In this case, a high potential difference is also produced between the output-side end side 10 and an environment of the piezoelectric transformer, the potential difference being sufficient to generate a strong electric field that ionizes a process gas.

In this way, the piezoelectric transformer 1 generates high electric fields that are able to ionize gases or liquids by electrical excitation. In this case, atoms or molecules of the respective gas or of the respective liquid are ionized and form a plasma. Ionization occurs whenever the electric field strength at the surface of the piezoelectric transformer 1 exceeds the ignition field strength of the plasma. In this case, the term ignition field strength of a plasma denotes the field strength required for ionizing the atoms or molecules.

The piezoelectric transformer 1 furthermore has an input-side end side 25. A length L of the piezoelectric transformer 1 is defined as a distance from the input-side end side 25 to the output-side end side 10.

FIG. 2 shows an apparatus 11 for generating an atmospheric pressure plasma. The apparatus 11 has the piezoelectric transformer 1 shown in FIG. 1. The piezoelectric transformer 1 here also has an insulation 12, which is arranged in the output region 3 of the piezoelectric transformer 1, wherein the insulation 12 at least partly covers the side surfaces of the transformer 1 in the output region 3 and the output-side end side 10 is free from the insulation 12. The insulation 12 can be formed, for example, by a shrinkable sleeve. The insulation 12 prevents undesired plasma ignitions from occurring along the output-side edges of the piezoelectric transformer 1. In an alternative exemplary embodiment, the piezoelectric transformer 1 does not have an insulation 12.

The apparatus 11 furthermore has a first contact element 13 and a second contact element 14. The first contact element 13 is connected to the first outer electrode 8 of the piezoelectric transformer 1. The second contact element 14 is connected to the second outer electrode of the piezoelectric transformer 1. An AC voltage can be applied to the first and the second outer electrode of the piezoelectric transformer 1 by means of the first and the second contact element 13, 14.

The contact elements 13, 14 each have a wire 15, at one end of which a block 16 is arranged. The block 16 of the contact elements 13, 14 is fastened to the respective outer electrode 8 by way of a non-releasable fastening. The block 16 can be fastened to the outer electrode 8 of the piezoelectric transformer 1, for example, by way of soldering, bonding, adhesive bonding or microsilver sintering. The block 16 and the wire 15 have a conductive material, for example copper.

The apparatus 11 furthermore has a mount 17. The mount 17 can have two half-shells 18, 19. FIG. 2 shows only a first half-shell 18 of the mount 17 in order to make illustration of the connection of the piezoelectric transformer 1 to the mount 17 possible. The second half-shell 19 may be identical to the half-shell 18 shown in FIG. 2. The half-shells 18, 19 are injection-molded elements.

The mount 17 has a first support element 22 and a second support element 23. In particular, the mount 17 has a plurality of first support elements 22. Each support element against which the input region 2 of the piezoelectric transformer 1 bears is referred to as a first support element 22. The mount 17 has a plurality of second support elements 23. Each support element against which the output region 3 of the piezoelectric transformer 1 bears is referred to as a second support element 23.

The third and the fourth side surface 20, 21 of the piezoelectric transformer 1 bear in each case against one of the first support elements 22 and against one of the second support elements 23. The support elements 22, 23 are in each case tapered in a wedge shape in the direction toward the piezoelectric transformer 1, such that the support elements bear against the piezoelectric transformer 1 in approximately linear fashion. The support elements 22, 23 are in this case arranged along the longitudinal direction z at the positions at which oscillation nodes are formed during operation of the transformer 1 at its operating frequency.

The arrangement of the support elements 22, 23 at the oscillation nodes of the piezoelectric transformer 1 and the wedge-shaped configuration thereof make it possible for the support elements 22, 23 to damp a movement of the piezoelectric transformer 1 in the longitudinal direction z only to a minimal extent.

The piezoelectric transformer 1 bears in the stacking direction x on both sides directly against each one of the first support elements 22 and against one of the second support elements 23. Two first support elements 22 and two second support elements 23 are in each case located opposite one another in the stacking direction x. In this way, movements of the piezoelectric transformer 1 relative to the mount 17 in the stacking direction x are prevented.

The mount 17 furthermore has first and second support elements 22, 23 between which the piezoelectric transformer 1 is enclosed in a y-direction, wherein the y-direction is perpendicular to the stacking direction x and perpendicular to the longitudinal direction z. Two first support elements 22 and two second support elements 23 are in each case located opposite one another in the y-direction. These support elements 22, 23 also run in a direction toward the piezoelectric transformer 1 in a wedge shape and bear against the piezoelectric transformer in approximately linear fashion. Movement of the piezoelectric transformer 1 relative to the mount 17 in the y-direction is prevented by the bearing against the support elements 22, 23.

As already discussed above, the first support elements 22 and the second support elements 23 are arranged at positions at which oscillation nodes are formed during operation of the piezoelectric transformer 1 at its operating frequency. The operating frequency is a frequency that is slightly lower than a parallel resonant frequency of the piezoelectric transformer.

If the piezoelectric transformer 1 is used to generate a non-thermal atmospheric pressure plasma, the plasma acts as a load. As a result, the frequency spectrum of the piezoelectric transformer 1 shifts. In particular, the maximum of the impedance is now at a frequency that is lower than the parallel resonant frequency and that can be selected as the operating frequency.

Two oscillation nodes are formed along the length L of the piezoelectric transformer 1 during operation of the transformer 1 at the operating frequency. The first support elements 22 are arranged at the position at which a first oscillation node is formed. The second support elements 23 are arranged at the position at which a second oscillation node is formed. The first oscillation node is located in the input region 2 of the transformer 1 and the second oscillation node is located in the output region 3.

It has been shown that, during operation of the piezoelectric transformer 1 at the operating frequency and during simultaneous generation of a plasma, which acts as an output-side load, the oscillation nodes are generated at a distance of ¼ L-A and ¾ L-B from the input-side end side 25, wherein A>0 and B>0. A and B are typically in a range of a few millimeters.

The shift of the oscillation nodes as a result of an applied load and as a result of the different moduli of elasticity of the input region and the output region is explained in more detail below with reference to simulation results. In FIGS. 3, 4 and 5, a piezoelectric transformer 1 having a length of L=72 mm is observed in each case. A piezoelectric transformer 1, which does not generate plasma and to which a load is not applied, is observed here. In FIGS. 3, 4 and 5, a transformer 1 without inner electrodes 4 has been observed in the simulations.

In FIG. 3, the frequency applied to the input region of the piezoelectric transformer is plotted on the abscissa axis. The curve K1 indicates the magnitude of the impedance Z of the piezoelectric transformer 1. The maximum of the curve K1 specifies the parallel resonant frequency of the piezoelectric transformer 1. This is at approximately 52.3 kHz. The minimum of the curve K1 specifies the series resonant frequency of the piezoelectric transformer. This is at approximately 51.5 kHz.

The curve K2 shows the voltage amplification as a function of the applied frequency. The curve K3 shows the phase.

In FIG. 4, the deflection that occurs at various positions of the piezoelectric transformer as a function of the applied frequency of the AC voltage is observed.

In FIG. 5, a shift of the second oscillation node formed in the output region 3 of the piezoelectric transformer 1 is observed as a function of the frequency of the applied AC voltage observed compared to the position ¾ L. In this case, the real part and imaginary part are observed separately. The point of intersection of the two curves shown in FIG. 5 coincides with the series resonance of the piezoelectric transformer. Here, the oscillation node is shifted by 2.4 mm in the direction of the input-side end side 25, that is to say the oscillation node in the output region 3 of the piezoelectric transformer 1 is located at a distance of ¾ L-2.4 mm from the input-side end side 25.

If the plasma generator is operated at an operating frequency that is closer to the parallel resonance than to the series resonance, the second oscillation node is shifted by somewhat less than 2.4 mm, as can be read out from the curves shown in FIG. 5.

Figure 6:
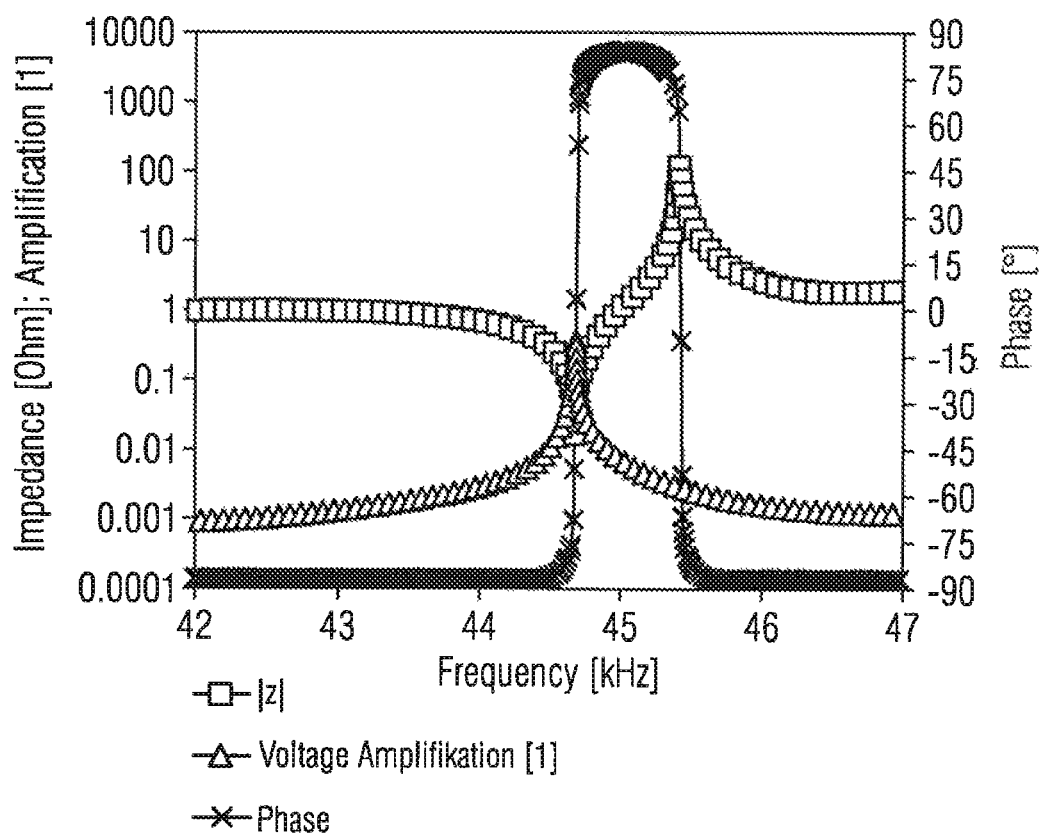
Figure 7:
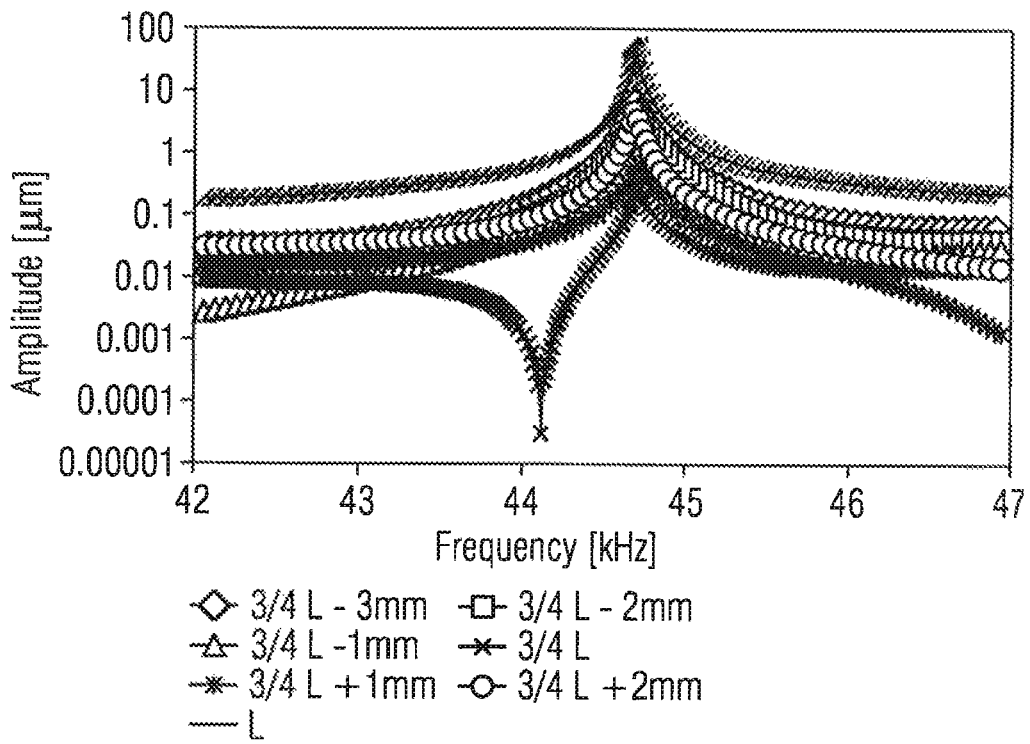
Figure 8:
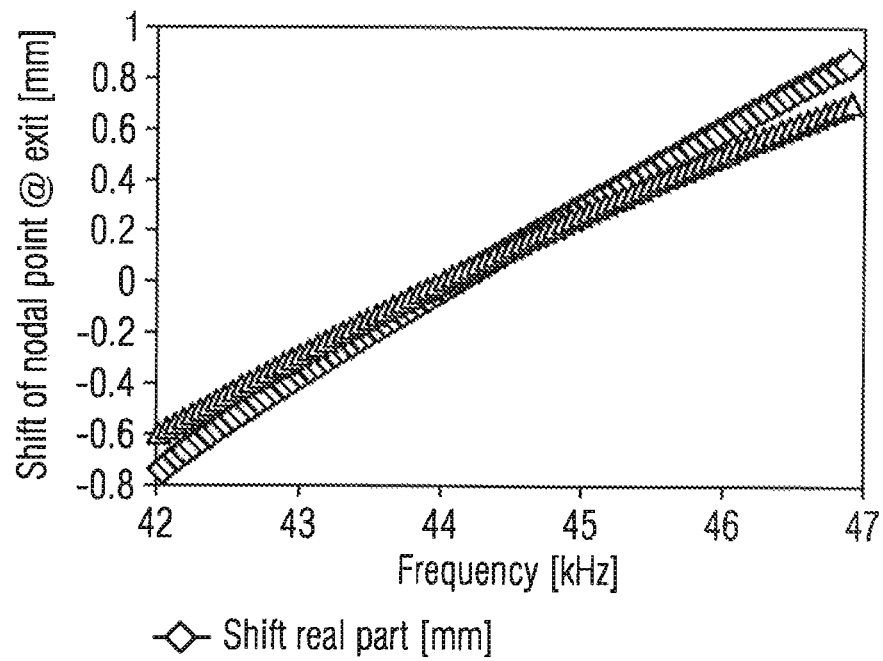

In FIGS. 6, 7 and 8, the corresponding graphs are illustrated for a piezoelectric transformer having a length of L=72 mm, in which an output-side load of 1Ω is applied. The inner electrodes 4 have also been taken into account in the simulations on which the figures are based.

It can be seen that the series resonant frequency and the parallel resonant frequency have shifted toward lower frequencies. As can be seen in FIG. 8, at the series resonant frequency, the second oscillation node is shifted by 0.2 mm in the direction of the output-side end side 10.

Figure 9:
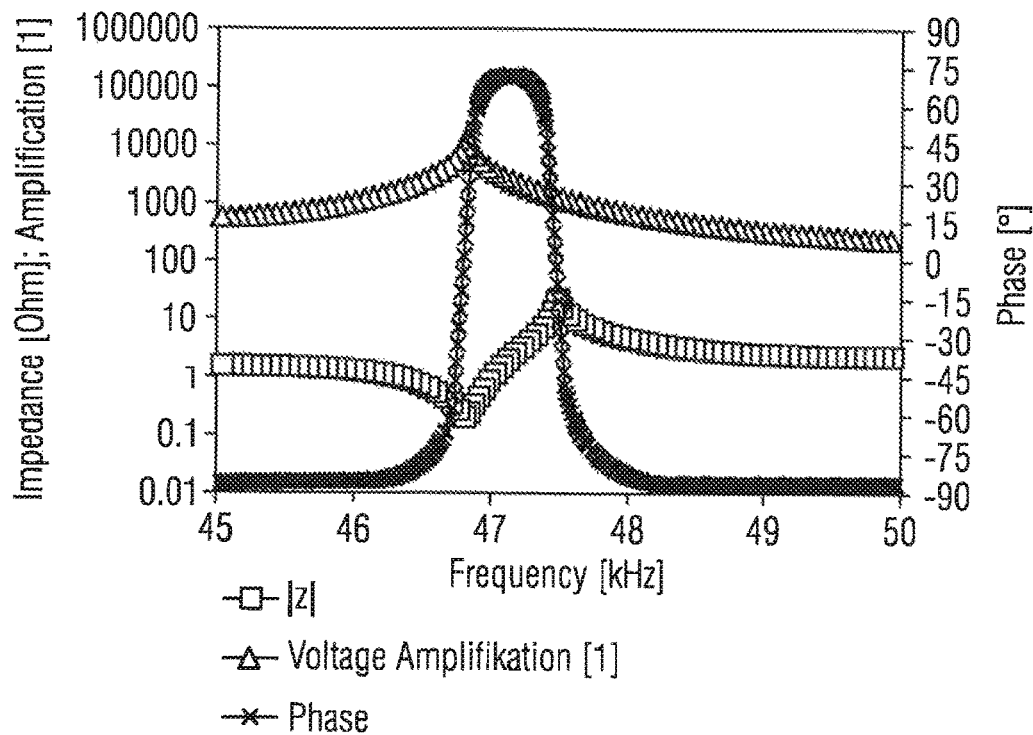
Figure 10:
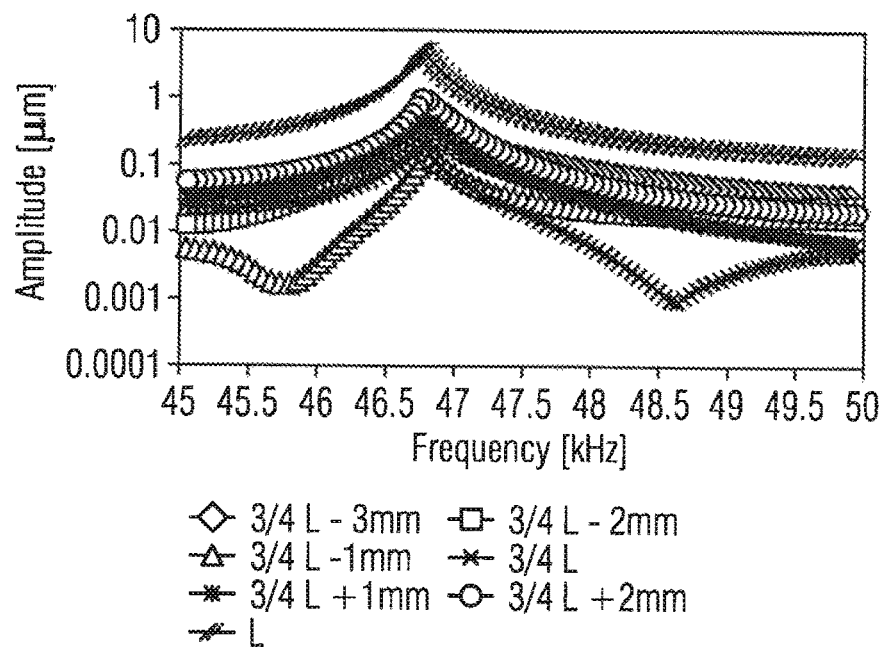
Figure 11:
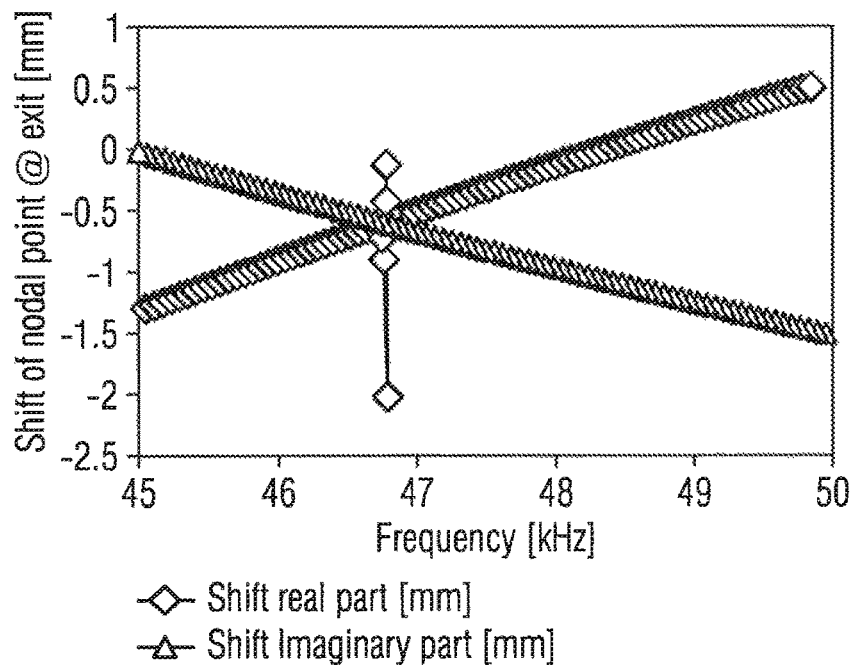

FIGS. 9, 10 and 11 illustrate the graphs for a piezoelectric transformer 1 to which a load of 1Ω is applied in series with 10 MΩ and in parallel with 8 pF. The inner electrodes 4 have also been taken into account in the simulations on which the figures are based. This scenario corresponds to the conditions that occur at the piezoelectric transformer 1 during plasma generation in the case of a real apparatus 11 for generating a plasma. The series resonant frequency is then at 46.9 kHz. The parallel resonant frequency is at 47.5 kHz, as shown in FIG. 9. As can be seen from FIG. 11, at the series resonant frequency, the second oscillation node is shifted by 0.6 mm in the direction of the input-side end side 25.

Figure 12:
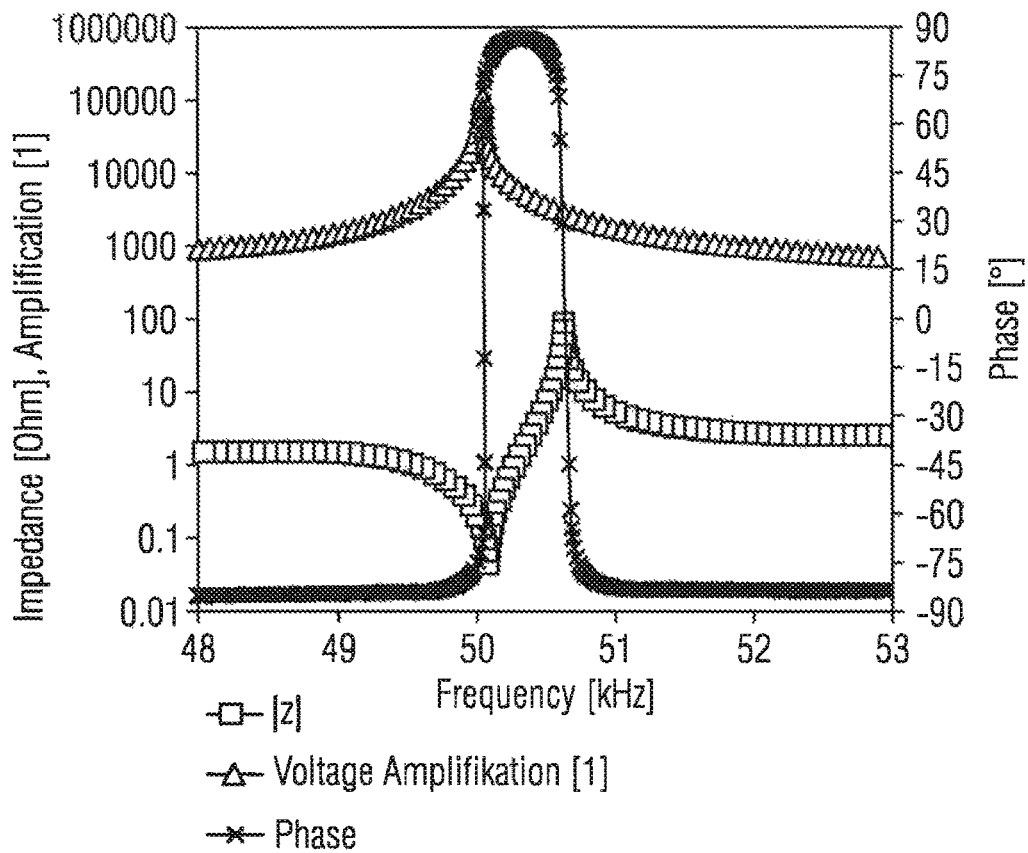
Figure 13:
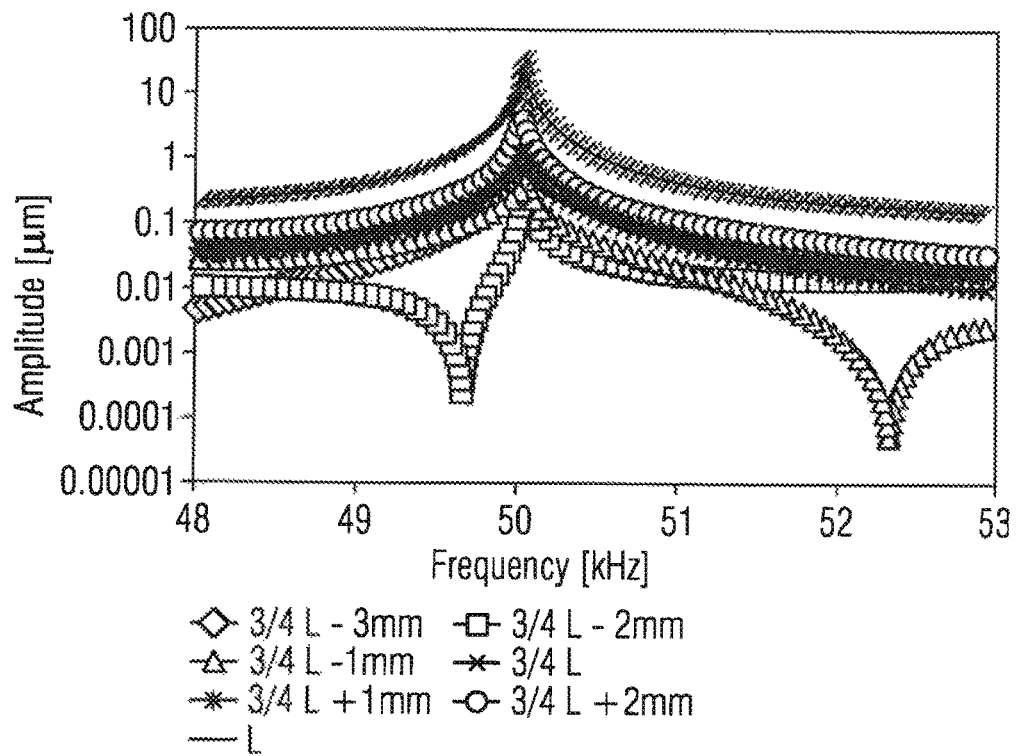
Figure 14:
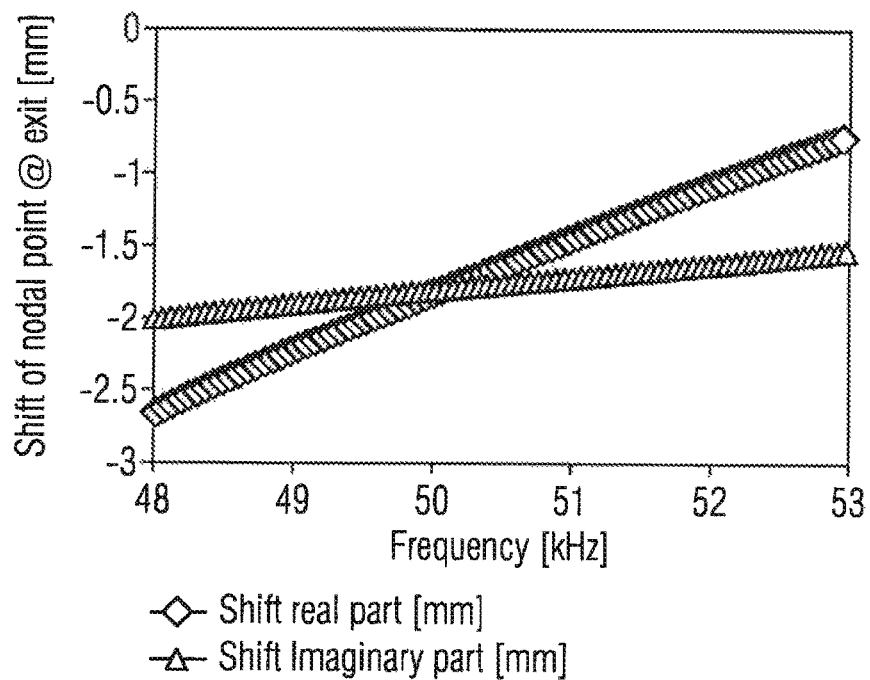

FIGS. 12 to 14 illustrate the graphs for a piezoelectric transformer 1 having a load of 1Ω in series with 10 GΩ in parallel with 1 pF. The inner electrodes 4 have also been taken into account in the simulations on which the figures are based. At the series resonant frequency, the second oscillation node is shifted by 1.9 mm in the direction of the input-side end side 25.

It was also able to be proved through experiments that the oscillation nodes shift toward the input region 2 when the piezoelectric transformer 1, whose input region 2 and output region 3 have different moduli of elasticity, is used for plasma generation, as a result of which a load is produced at the output-side end side 10. The results of the experimental study are illustrated in FIGS. 15 to 17.

A free-flowing powder was spread onto a piezoelectric transformer 1. The piezoelectric transformer 1 was then actuated at an operating frequency. The less the transformer 1 moves at the respective location, the longer the powder remains at the corresponding locations. The locations at which the powder remained accordingly indicate where the oscillation nodes are formed.

Figure 15:
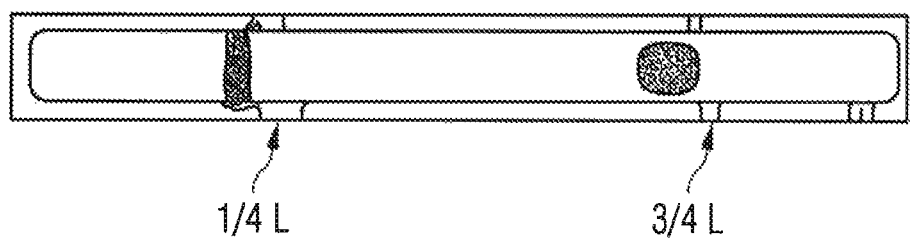
FIGS. 15 to 17 show measurement results showing the positions of the oscillation nodes in a piezoelectric transformer.

The distances of ¼ L and ¾ L from the input-side end side are marked in FIG. 15. It can be seen that the first oscillation node is at a distance of less than ¼ L from the input-side end side 25 and that the second oscillation node is at a distance of less than ¾ L from the input-side end side 25. The first and the second oscillation node can each be seen on the powder remaining on the transformer 1.

Figure 16:
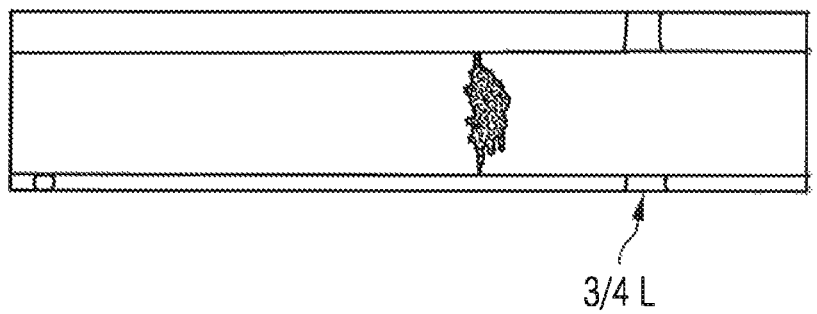
Figure 17:
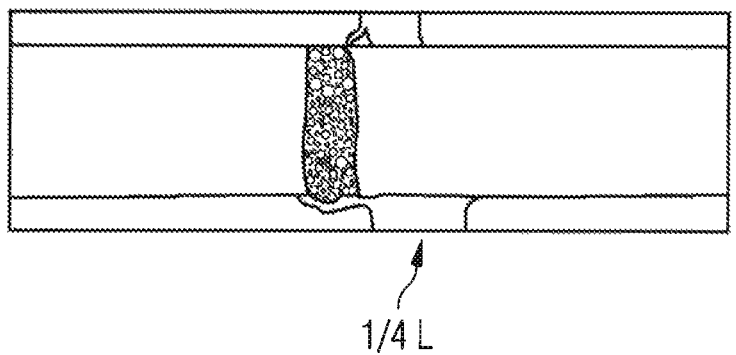

FIG. 16 shows a detailed view of the output region 3. It can be seen that the oscillation node is shifted in the output region 3 by approximately 1.5 mm in the direction of the input-side end side from the position ¾ L. FIG. 17 shows a detailed view of the input region 2. The oscillation node is shifted in the input region by 0.5 mm in the direction of the input-side end side 25 from the position ¼ L. The oscillation node in the output region 3 accordingly experiences a greater offset than the oscillation node in the input region 2.

The invention claimed is:

1. An apparatus for generating an atmospheric pressure plasma, the apparatus comprising:
   a first support element; and
   a piezoelectric transformer supported by the first support element,
   wherein the piezoelectric transformer is supported at a position at which an oscillation node is formed when the piezoelectric transformer is operated at an operating frequency that is lower than its parallel resonant frequency, and wherein the piezoelectric transformer is configured to generate a non-thermal atmospheric pressure plasma.

2. The apparatus according to claim 1, wherein a difference between the operating frequency and the parallel resonant frequency is between about 10 kHz and 0.1 kHz.

3. The apparatus according to claim 1, wherein the parallel resonant frequency is defined as a frequency at which an impedance of the piezoelectric transformer has a maximum when an AC voltage at the frequency is applied to the piezoelectric transformer and the piezoelectric transformer does not generate plasma.

4. The apparatus according to claim 1, wherein the piezoelectric transformer has an input region and an output region, wherein the input region has an input-side end side of the piezoelectric transformer, the input-side end side pointing away from the output region, and wherein the output region has an output-side end side, which points away from the input region.

5. The apparatus according to claim 4, wherein the piezoelectric transformer has a length L, wherein the length L specifies a distance of the input-side end side to the output-side end side, and wherein a distance of the position on which the piezoelectric transformer is supported on the first support element from the input-side end side is in a range between ¼ L-5.0 mm and ¼ L-0.05 mm.

6. The apparatus according to claim 4, further comprising a contact element fastened to the piezoelectric transformer and designed to apply an AC voltage to the input region, and wherein the contact element is fastened at a position at the input region whose distance from the input-side end side corresponds to the distance from the position at which the first support element is arranged.

7. The apparatus according to claim 4, wherein the input region is configured to convert an applied AC voltage to a mechanical oscillation, and wherein the output region is configured to convert a mechanical oscillation to an electrical voltage.

8. The apparatus according to claim 1, further comprising a second support element on which the piezoelectric transformer is supported, wherein the piezoelectric transformer is supported on the second support element at a position at which an oscillation node is formed when the piezoelectric transformer is operated at the operating frequency and the piezoelectric transformer is configured to generate the non-thermal atmospheric pressure plasma.

9. The apparatus according to claim 8, wherein a distance of the position at which the piezoelectric transformer is supported on the second support element from an input-side end side is in a range between ¾ L-5.0 mm and ¾ L-0.05 mm.

10. The apparatus according to claim 9, wherein a distance of the position at which the piezoelectric transformer is supported on the first support element from the input-side end side is ¼ L-A, wherein a distance of the position at which the piezoelectric transformer is supported on the second support element from the input-side end side is ¾ L-B, and wherein B>A.

11. The apparatus according to claim 1, wherein the first support element is configured in such a way that it elastically deforms in an event of compression and in an event of expansion of the piezoelectric transformer.

12. The apparatus according to claim 1, wherein the first support element comprises a material selected from the group consisting of polybutylene terephthalate, polytetrafluoroethylene, polyamide and polyamide comprising glass-fiber proportions.

13. The apparatus according to claim 1, wherein the first support element has a shape that tapers in a wedge shape in a direction of the piezoelectric transformer and bears against the piezoelectric transformer in approximately linear fashion.

14. The apparatus according to claim 1, wherein the piezoelectric transformer is configured to generate the non-thermal atmospheric pressure plasma at an output-side end side.

15. A plasma generator comprising:
    an apparatus according to claim 1; and
    a housing in which the apparatus is arranged.

16. The plasma generator according to claim 15, further comprising an actuation circuit for actuating the piezoelectric transformer, the actuation circuit being arranged in the housing.

\* \* \* \* \*